(12) United States Patent
Edwards et al.

(10) Patent No.: US 7,086,047 B1
(45) Date of Patent: Aug. 1, 2006

(54) DETERMINING HARDWARE GENERATED BY HIGH LEVEL LANGUAGE COMPILATION THROUGH LOOP OPTIMIZATIONS

(75) Inventors: Stephen G. Edwards, Woodbine, MD (US); Donald J. Davis, Ellicott City, MD (US); Jonathan C. Harris, Ellicott City, MD (US); James E. Jensen, Ellicott City, MD (US); Andreas B. Kollegger, Baltimore, MD (US); Ian D. Miller, Charlotte, NC (US)

(73) Assignee: Xilinx, Inc., San Jose, CA (US)

( * ) Notice: Subject to any disclaimer, the term of this patent is extended or adjusted under 35 U.S.C. 154(b) by 650 days.

(21) Appl. No.: 10/310,362

(22) Filed: Dec. 4, 2002

(51) Int. Cl.
*G06F 9/45* (2006.01)

(52) U.S. Cl. ...................... 717/160; 717/106

(58) Field of Classification Search ........ 717/106–153, 717/160; 716/3, 18
See application file for complete search history.

(56) References Cited

U.S. PATENT DOCUMENTS 6,539,520 B1 * 3/2003 Tiong et al. .................. 716/3
6,952,816 B1 * 10/2005 Gupta et al. .................. 716/18
2004/0015915 A1 * 1/2004 Lam et al. .................. 717/150
2005/0028135 A1 * 2/2005 Burnette et al. ............ 717/106

OTHER PUBLICATIONS

U.S. Appl. No. 10/310,260, filed Dec. 4, 2002, Edwards et al.
U.S. Appl. No. 10/310,336, filed Dec. 4, 2002, Harris et al.
U.S. Appl. No. 10/310,520, filed Dec. 4, 2002, Miller et al.

* cited by examiner

*Primary Examiner*—Wei Zhen
*Assistant Examiner*—Mulubrhan Tecklu
(74) *Attorney, Agent, or Firm*—Pablo Meles; LeRoy D. Maunu

(57) ABSTRACT

A method of processing a program written in a general purpose programming language to determine a hardware representation of the program can include generating a language independent model of the program written in a general purpose programming language (100) and identifying a loop construct within the language independent model (705). A determination can be made as to whether the loop construct is bounded (725). If so, a loop processing technique can be selected for unrolling the loop construct according to stored user preferences 735). The loop construct can be replicated in the language independent model as specified by the selected loop processing technique (740, 755).

26 Claims, 2 Drawing Sheets

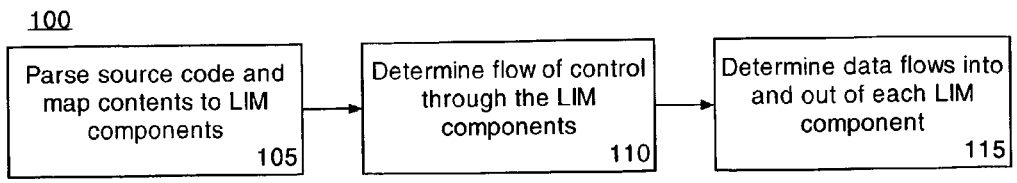
FIG. 1
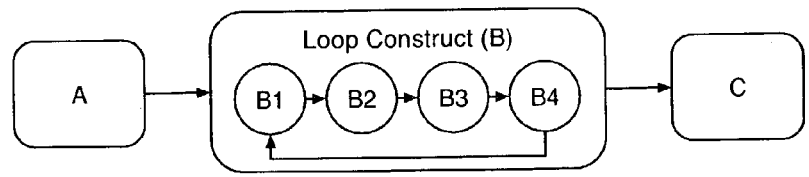
FIG. 2
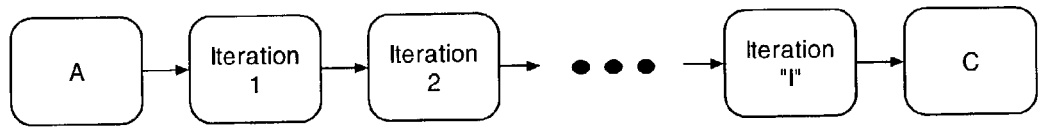
FIG. 3
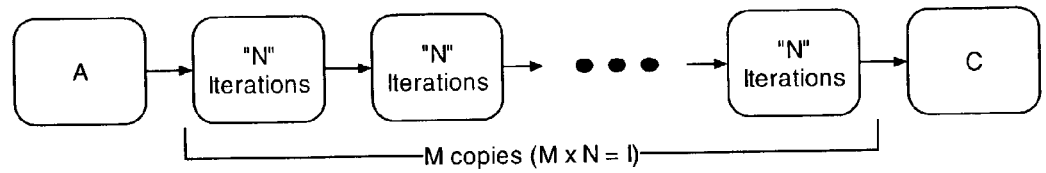
FIG. 4
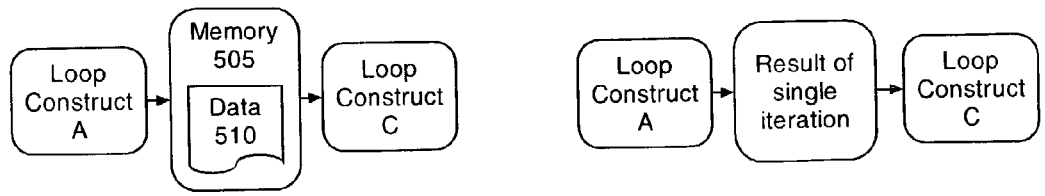
FIG. 5                    FIG. 6

DETERMINING HARDWARE GENERATED BY HIGH LEVEL LANGUAGE COMPILATION THROUGH LOOP OPTIMIZATIONS

BACKGROUND OF THE INVENTION

1. Field of the Invention

The present invention relates to the field of hardware design and, more particularly, to generating a hardware description from a general-purpose, high level programming language.

2. Description of the Related Art

The design of field programmable gate arrays (FPGAs) or application specific integrated circuits (ASICs) typically begins with the development and validation of an algorithm which the integrated circuit (IC) is intended to implement. Presently, developers validate algorithmic designs by implementing algorithms in a high level programming language such as C, C++, Java, or the like. High level programming languages provide designers with the ability to rapidly prototype an algorithm, explore the algorithm in further detail, and ultimately prove or validate that the algorithm can sufficiently process the data for which the algorithm and the IC are being developed.

Once an algorithm has been validated, the designer can begin the process of transforming the high level language design into a hardware description implementation using VERILOG, VHDL, or some other hardware description language alternative. Presently, this transformation is performed manually by designers. As a result, the process can be very time intensive and error prone. Transformation of a high level language design to a hardware description language implementation involves tracking an extraordinary number of inter-relationships between timing signals and data. The designer must think in terms of clock cycles and relative timing between signals in the hardware description language. State machines must be designed that are capable of correctly moving data through the hardware description language code, and which are capable of enabling the correct subsystems at the proper times.

Attempts have been made to develop improved tools to aid in the transition from a high level language design to a hardware description language design. For example, specialized programming languages such as Handel-C and SystemC are enhanced programming languages that, when compiled, can produce a hardware description conforming to a particular hardware description language specification such as VERILOG or VHDL. Specialized programming languages such as these, however, are "hardware aware" in that the languages include significant enhancements in the way of standard libraries and extensions which allow programs written in these languages to be compiled into suitable hardware descriptions.

Handel-C, SystemC, and other "hardware aware" languages rely on a technique known as progressive elaboration. Under the technique of progressive elaboration, a designer codes a design in a high level language. After initial algorithmic verification, the designer successively adds more information and/or hardware aware constructs to the code to direct the compiler in terms of implementation. A final design is achieved by adding sufficient information to the source code to generate the desired results.

While "hardware aware" languages do help to ease the translation of validated algorithms to hardware description language designs, there are disadvantages to the use of specialized languages. One such disadvantage is the time required for developers to familiarize themselves with a different special purpose language. Although "hardware aware" languages typically are rooted in a known high level language such as the C programming language, developers still must learn special enhancements and additions to the language which make the generation of a hardware description language output possible.

Another disadvantage of specialized "hardware aware" languages can be the cost associated with purchasing the language as a design tool. The acquisition of a specialized language as a design tool adds yet another expense to the IC development process. Finally, "hardware aware" design tools which rely upon progressive elaboration design techniques require source code modifications to work properly.

Accordingly, a need exists in the electronics industry for an efficient way of capturing design functionality in a more abstract manner than is presently available with conventional hardware description languages.

SUMMARY OF THE INVENTION

The invention disclosed herein provides a method and apparatus for processing loop constructs when generating a hardware description from a program written in a general-purpose, high level programming language. In particular, the present invention can determine more efficient hardware descriptions or programmatic hardware representations, at least in part, through an analysis of loop constructs found in the source code description of an algorithm to be implemented as an integrated circuit.

One aspect of the present invention can include a method of processing a general-purpose, high level language program to determine a hardware representation of the program. The method can include generating a language independent model of the general-purpose, high level language program. A loop construct within the language independent model can be identified. For example, within the loop construct, a decision component, an initial value of a loop index, an ending value for the loop index, and an update expression for updating the loop index can be identified.

A determination as to whether the loop construct is bounded can be made. For example, determining whether the loop construct is bounded can include, but is not limited to, determining whether the ending value of the loop index is a constant value, determining whether the initial value of the loop index is a constant value, and determining whether the update expression produces a predictable result.

If the loop construct is bounded, a loop processing technique for unrolling the loop construct can be selected according to stored user preferences. The loop construct can be unrolled by replicating, in the language independent model, a body portion of the loop construct as specified by the selected loop processing technique. The steps of identifying a loop construct, determining whether the loop construct is bounded, selecting a loop processing technique, and unrolling the loop construct can be repeated for additional loop constructs in the language independent model. The language independent model then can be scheduled and a hardware description language representation can be generated from the resulting language independent model.

If the selected loop processing technique is full loop unrolling, the method can include determining a maximum number of iterations for the loop construct, copying the body portion of the loop construct until the total number of body portions is equal to the maximum number of loop construct iterations, and sequencing the body portions according to when the loop construct would have been enabled and the existence of control decisions within the loop construct. Any references to the loop index in each body portion can be replaced with a constant value associated with that particular body portion copy.

If the selected loop processing technique is partial loop unrolling, the method can include determining a maximum number of iterations for the loop construct, copying the body portion of the loop construct into the language independent model a predetermined number of times which is less than the maximum number of iterations, and encapsulating each body portion within a sub-loop construct such that the total number of executions of each body portion within the sub-loops is equal to the maximum number of iterations. The data flows between the respective sub-loop constructs can be connected such that each sub-loop construct receives proper data input.

Another aspect of the present invention can include a method of processing a general-purpose, high level language program to determine a hardware representation of the program wherein loop constructs are processed using a parallelization technique. The method can include generating a language independent model of the general-purpose, high level language program and identifying at least two loop constructs within the language independent model having a data processing dependency. A determination can be made as to whether each loop construct is bounded. If so, the method can include identifying a data processing order for the loop constructs wherein data generated by one of the loop constructs is consumed by a next one of the loop constructs in stepwise fashion. Each of the loop constructs can be sequenced to function in stepwise fashion.

Notably, if the loop constructs do not function in stepwise fashion, the logic of one or more of the loop constructs can be ordered such that data generated by one of the loop constructs is consumed by a next one of the loop constructs in stepwise fashion. If needed or desired, for example to ensure stepwise operation of the parallelized loop constructs, a control mechanism can be inserted between each loop construct to enable the loop constructs to signal that data is available or that data is needed. The language independent model can be scheduled and a hardware description language representation can be generated from the resulting language independent model.

BRIEF DESCRIPTION OF THE DRAWINGS

There are shown in the drawings embodiments which are presently preferred, it being understood, however, that the invention is not limited to the precise arrangements and instrumentalities shown.

FIG. 1 is a flow chart illustrating a method of determining a language independent model which can be used with the present invention.

FIG. 2 is a schematic diagram illustrating an excerpt from the language independent model which represents a loop construct in accordance with the present invention.

FIG. 3 is a schematic diagram illustrating an excerpt from the language independent model after a loop construct has been unrolled in accordance with the present invention.

FIG. 4 is a schematic diagram illustrating an excerpt from the language independent model after a loop construct has been partially unrolled in accordance with the present invention.

FIG. 5 is a schematic diagram illustrating an excerpt from the language independent model wherein two loop constructs have been identified as sharing a data dependency.

FIG. 6 is a schematic diagram illustrating an excerpt from the language independent model after loop parallelization has been performed on the two loop constructs of FIG. 5 in accordance with the present invention.

DETAILED DESCRIPTION OF THE INVENTION

Figure 7:
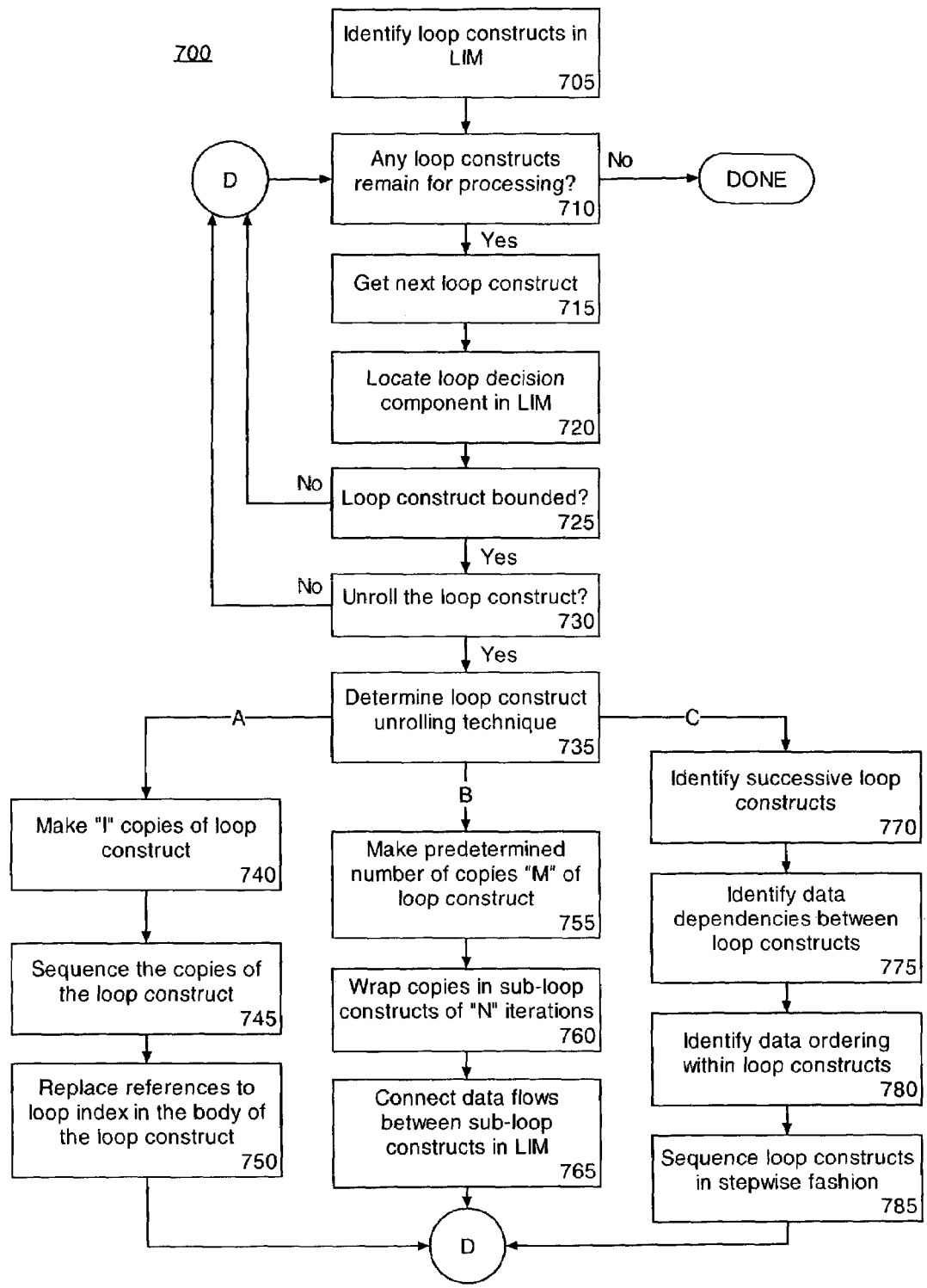
FIG. 7 is a flow chart illustrating a method of loop processing in accordance with the present invention.

The invention disclosed herein provides a method and apparatus for processing loop constructs when generating a hardware description from a program written in a general-purpose, high level programming language. In particular, the present invention can determine more efficient hardware descriptions or programmatic hardware representations, at least in part, by analyzing and/or restructuring loop constructs found in the source code description of an algorithm to be implemented as an integrated circuit. One of several different loop construct processing techniques can be selected for processing the loop construct based upon the loop construct itself and/or user profile information.

The present invention utilizes a language independent model (LIM) which is a programming language neutral and hardware neutral representation of a program and the program structure. Generally, the source code of a program can be mapped to the LIM. From the LIM, a hardware description language specification can be derived. The LIM is based upon the premise that many general-purpose, high level programming languages share a similar if not equivalent set of basic programming constructs for expressing logic. These basic programming constructs can include operations, whether arithmetic, logical, and/or bitwise, sequences, branches, loops, memory assignments and references, compound statements, and subroutine calls. Notably, in cases where more complex programming constructs exist, the complex programming constructs typically can be reduced to a set of equivalent primitive or less complex programming constructs. The LIM provides a hierarchical, abstract representation of these programming constructs.

The LIM is formed of a collection of components, wherein each component refers to a unit of functionality. The component can be a primitive, which refers to a low level "black box", or a module which refers to a container or collection of other components. Each component of the LIM can have one or more attributes which describe how that component relates to other components of the LIM. For example, component attributes can specify any external data values which the component requires in order to perform a function. The specified data values must be provided as inputs to the component by the components that produce the values. Component attributes also can specify any data values which the component produces for external consumption. The component can provide these data values as execution output, which in turn can be provided as input to other components of the LIM. Component attributes further can specify the order of execution of components in the LIM. Still, the examples disclosed herein are provided for purposes of illustration, and as such, are not intended to be an exhaustive listing of possible component attributes. In any case, the component attributes can be derived from a straightforward semantic analysis of program source code.

Notably, as a module is itself a component, components in the LIM can be hierarchically nested to an arbitrary depth. Different types of modules can exist which represent or correspond to different programming constructs. For example, common module types can include block modules, branch modules, and loop modules. A block module represents an ordered sequence of components. A branch module specifies the execution of one component or another based upon the value of a component which computes a conditional value. A loop module executes a body component iteratively until a conditional component produces a termination condition.

FIG. 1 is a flow chart illustrating a method 100 of deriving a LIM in accordance with the inventive arrangements disclosed herein. The method 100 can begin in step 105 by parsing the source code of a general-purpose, high level language program. The source code can be parsed into a hierarchy of LIM components. For example, the source code can be parsed with a grammar based parser, a step which typically is performed when compiling source code. The parser can produce a parse tree, which can be analyzed to determine the parse tree contents. Rather than generating assembly code, each syntactic construct can be mapped to one or more LIM components. For instance, an "if" statement can cause a branch component to be produced, which in turn may become a component in a higher level module. In this manner, the LIM description can be built from low to high level constructs.

In step 110, the flow of control through the various components of the LIM can be determined. Each module can specify the flow of control through its constituent components. That is, the logical order in which the various components of the LIM are to execute can be defined. Flow of control can be classified as software control flow or hardware control flow. For most modules, the two classifications are equivalent. For block modules, however, the meaning of software and hardware control flow diverge. Software control flow for a block module indicates that the constituent components within the block module execute one at a time in a sequential manner. Hardware control flow for a block module indicates that each component can begin execution in parallel. A block module can maintain both descriptions. A module can be said to have completed module have completed execution.

In step 115, the data flow into and out of each of the LIM components can be determined. By following the software flow of control through the LIM, the flow of data into and out of each component and module can be charted. Data flow can be represented by the annotation of data dependency information on each component. A data dependency indicates the source of a data value that is needed by a component before that component can begin execution. For each data value required by a component, a separate data dependency exists, and therefore, can be recorded for each different control flow path leading to the component. Using the type information obtained from the source code, each data flow also can be annotated with size information, a static initial value if one exists, and a type.

Data flows into and out of non-local storage, for example the heap rather than the stack, also can be recorded. This allows a picture of the global storage to be modeled. The global storage can be transformed into registers and memory banks in the hardware implementation.

At this point, a number of different optimizations can be applied to the LIM to improve the efficiency of any hardware representations resulting from a translation of the LIM. One such optimization can include loop unrolling. Loop constructs within programs are characterized by feedback in the control or execution path of the program. For example, common forms of loop constructs can be identified by source code statements including, but not limited to "for", "while", "do-while", and/or "goto" statements. A loop construct encountered in a program which is being processed to generate a hardware representation of the program indicates that a section of hardware representing the loop body of the loop construct (i.e. one or more body components) is to be re-used over time according to the number of iterations of the loop construct. The number of iterations is determined by a loop construct.

The loop index can be modified by logic in the loop construct, referred to as an update expression, such that the loop index can be tested either before or after each iteration of the loop body depending upon the particular statements used within the loop construct. The loop body of a loop construct can be continually executed so long as the test of the loop index is successful. When the test fails, the loop construct can exit and processing can continue with any logic which may follow the loop construct.

FIG. 2 is a schematic diagram illustrating an excerpt from the LIM which represents a loop construct in accordance with the present invention. As shown, the loop construct "B" is disposed between two nodes A and B of the LIM which can represent either modules and/or components. The loop construct B can include several sub-constructs B1, B2, B3, and B4 which can represent components and/or modules. For purposes of illustration, however, the sub-constructs B1–B4 can be assumed to be components. Accordingly, the component B1 can specify a loop index as well as an update expression for tracking the loop iterations by adjusting the loop index. The loop test also can be specified by component B1. Components B2 and B3 can form the loop body of the loop construct "B" which is to be executed for "I" iterations. Component B4 can include any necessary loop tracking information and/or an indication to return or go to component B1.

The scheduling process, which will be described herein in further detail, can ensure that each iteration of the loop construct requires at least 1 clock cycle. This can be performed by inserting a flip-flop in the control path at the bottom or end of the loop body if, and only if, the loop body is not guaranteed to take 1 clock cycle of its own accord. Additionally, to preserve any data values used in the loop construct, a register can be inserted at the bottom of the loop construct to capture modified feedback values to be used by the next iteration.

Since each iteration of the loop is guaranteed to consume at least 1 clock cycle, and the loop body is re-used for each iteration, new data cannot be applied to the generated circuit until the hardware representation of the loop construct has completely processed the current input data set. In illustration, for a loop construct which iterates 10 times, new data can be applied, at best, every 10 clock cycles, resulting in a throughput limitation on the generated circuit. To alleviate this situation and produce higher performance hardware having higher throughput, the loop constructs of the underlying general-purpose, high level language program can be processed.

FIG. 3 is a schematic diagram illustrating an excerpt from the LIM after a loop construct has been fully unrolled in accordance with the present invention. As shown in FIG. 3, the loop body of the loop construct of FIG. 2, which was illustrated as components B2 and B3, has been replicated within the LIM. Each of the nodes labeled as Iteration 1, Iteration 2, through Iteration "I", represents the loop body of the loop construct, wherein the total number of iterations "I", including all replicated loop bodies and the original loop body, is equal to the total number of iterations of the original loop body of FIG. 2.

More particularly, bounded loop constructs, or those loop constructs which are guaranteed to execute a fixed number of iterations or up to a maximum number of iterations are identified. One copy of the loop body can be made for each iteration. The loop body copies can be sequenced one following the next. The loop construct, once unrolled, does not re-use the logic for each iteration. Each iteration has a copy of the necessary logic, thereby eliminating the limitation on new data input to the design which was inherent to the unprocessed loop construct. Notably, the loop index in each iteration can be translated to a constant value.

Once unrolled, there are "N" total loop bodies which are created to implement the functionality of the loop. These loop bodies are connected one to the next according to the data flows from one iteration of the loop to the next. If data is fed-back in the loop, for example if iteration n+1 uses a data value calculated in iteration n, then that relationship becomes a data flow from loop body copy I(n) to I(n+1). The control signal enables all "N" copies of the loop body simultaneously according to when the rolled-up loop would have been enabled. Such is the case unless the loop body contains control decisions which would cause the loop to terminate prematurely such as a "break", a "continue", or an "exception", in which case each copied body will be sequenced, by control, one after the other. Thus, when scheduling creates an enable for each component in each loop body, that component will execute as soon as the data for that component is available and the component is enabled. The component will not necessarily have to wait for the previous iterations to complete.

FIG. 4 is a schematic diagram illustrating an excerpt from the LIM after a loop construct has been at least partially unrolled in accordance with the present invention. In cases where the size of the resulting hardware implementation is to be limited, full loop unrolling may not be desired. Accordingly, as an alternative, a number of copies of the loop body, "M" copies, can be created such that each of the "M" copies is re-used "N" times. According to this aspect of the present invention, "M" copies of the loop body, each executing "N" times in a sub-loop, results in the total number of iterations "I", such that M*N=I. Data and control flow from one sub-loop to the next, including loop indexes, can begin from where the previous sub-loop finished. While not completely eliminating the limitation on the introduction of new data, partial loop unrolling relaxes the limitation. Partial loop unrolling can result in a design which can be implemented with less hardware than a FIG. 5 is a schematic diagram illustrating an excerpt from the LIM wherein two loop constructs A and C share a data dependency. More particularly, loop constructs are interdependent by the fact that loop construct A generates data 510 which is written to memory 505. Loop construct C consumes data 510 from the memory 505 after the data 510 is generated by loop construct A. Another loop processing technique referred to as loop parallelization can be applied to chains of 2 or more interdependent loop constructs in the same general-purpose, high level language program such as loop constructs A and C.

FIG. 6 is a schematic diagram illustrating an excerpt from the LIM after loop parallelization has been performed in accordance with the present invention. In particular, FIG. 6 represents the output of loop parallelization after application to the loop constructs of FIG. 5. Although loop parallelization can be applied to 2 or more loop constructs, for purposes of illustration, loop parallelization is explained herein with reference to two loop constructs A and C.

As show in FIG. 6, loop parallelization leaves both loop constructs as iterative processing modules. The loop parallelization technique can identify the data dependency between the loop construct A and C, thereby noting that loop construct A generates data that is consumed by loop construct C. Typically, loop construct A would be required to complete execution prior to loop construct C beginning execution. Loop parallelization can detect cases in which the second loop construct, here loop construct C, consumes one data element per iteration as loop construct A generates the one element per iteration that is needed by loop construct C.

Accordingly, loop parallelization detects those cases in which the two loop constructs can execute simultaneously in "lock-step" fashion such that loop construct A produces a data element and loop construct C then consumes the data element as it is generated. Because the data value can be provided from the data producer directly to the data consumer, the memory which previously linked loop constructs A and C can be eliminated. It may be necessary, however, to establish a communications mechanism between the two loop constructs should a possibility exist that the two loop constructs can become out of "lock-step" causing one or both loops to pause execution until the other is ready.

Those skilled in the art will recognize that a similar loop synchronization technique can be applied in cases wherein multiple data dependencies are detected which can be correlated to more than 2 loop constructs, or if multiple data elements are generated and/or consumed per iteration by the chained loop constructs. The loop parallelization has the general effect of coalescing the 2 loop constructs into a single loop construct.

FIG. 7 is a flow chart illustrating a method 700 of loop processing in accordance with the present invention. The method 700 can begin in a state wherein the LIM has been determined. Accordingly, in step 705, loop constructs within the LIM can be identified. In step 710, if any loop constructs require processing the method can continue to step 715. If not, the method can end. In step 715, the first loop construct, or next loop construct if the method 700 has repeated, can be identified or retrieved. In step 720, the loop decision component can be identified. The loop decision component corresponds to the source code which tests the loop index for a false condition so that the loop construct can eventually exit. More particularly, the final value that will be provided to the loop index can be identified. The initial value of the loop index also can be identified. Additionally, the loop update expression can be identified.

In step 725, a determination can be made as to whether the loop construct is bounded. The loop construct can be tested for three conditions which, if met, indicate that the loop construct is bounded. The first condition is that the final value of the input to the loop decision must be a constant value. The next condition is that the initial value of the loop index must be a constant value. The last condition is that the update expression for the loop index must be an expression with predictable behavior. That is, the equation for updating the loop index is determinate at compile time, for example as specified by an expression such as "loop index=loop index+1" rather than an expression which relies upon user supplied input. If the loop updated expression is determinate, then the value of the loop index can be predicted for any given iteration of the loop. If the loop construct is not bounded, the method can loop back to step 710 to process further loop constructs. If the loop construct is bounded, the method can proceed to step 730.

In step 730, a determination can be made as to whether the loop construct is to be unrolled. A user profile can be consulted which specifies conditions for unrolling loop constructs. For example, the user profile can specify that loop constructs which do not iterate at least a predetermined number of times are not to be unrolled. Notably, the iteration threshold also can be specified in the user profile. Still, the user profile can specify which type of loop processing, if any, is to be applied to loop constructs of the LIM on a per loop construct basis.

In step 735, a loop unrolling technique can be determined. For example, a determination can be made as to whether the loop construct is to be fully unrolled, partially unrolled, or is to undergo parallelization. This determination can be made, at least in part, with reference to the user profile. For example, the user profile can specify the threshold number of iterations and a selected loop construct unrolling technique to be used in processing the loop construct for a given number of iterations or a number of iterations falling within a specified range. Accordingly, a user can work within specified resource requirements. Additionally, the user preferences can specify whether loop unrolling, as well as the particular variety of loop processing, for example loop parallelization, is to be applied for specific loop constructs within the LIM.

After completion of step 735, the method can proceed down one of the paths A, B, or C. If the loop construct unrolling technique is full loop unrolling, the method can take path A. If the loop construct unrolling technique is partial loop unrolling, the method can take path B. Path C can be taken if loop parallelization is to be applied to the loop construct.

In step 740, in the case where full loop unrolling is to be applied, "I" copies of the loop body of the loop construct can be made and included in the LIM such that the number of copies, including the original loop body (hereafter copies), is equivalent to the maximum number of iterations of the loop body as determined by the loop index and update expression. In step 745, the copies can be sequenced together within the LIM such that each copy (or iteration), begins execution, or is enabled, after the previous copy completes execution.

In step 750, references to the loop index in the copies of the loop body can be replaced with an appropriate constant value. The constant value used in each copy can be dependent upon which iteration the copy represents. For example, if the loop index value is 1 for the first copy, and the update expression increments by one for each subsequent iteration, the constant value used to replace the loop index for the second copy which represents the second iteration can be 1+1, the constant for the third copy representing the third iteration can be 1+2, etc. Still, it should be appreciated that the index value can be updated in any of a variety of ways as specified by "I" iterations of the update expression. Accordingly, the invention is not intended to be limited by the specific examples disclosed herein. After completion of step 750, the loop optimization process can loop back to step 710 to process further loop constructs as necessary.

In step 755, a predetermined number of copies "M" of the loop body of the loop construct can be generated. As noted, the number of copies can be determined at least in part by the user profile. For example, in cases where hardware resources are a concern, the user profile can specify the maximum number of copies to be made. Alternatively, the user profile can specify the maximum number of iterations to be executed by each copy, which therefore specifies the number of copies to be generated for a given maximum loop index value. Notably, parameters for partial loop unrolling can be specified on a per loop construct basis.

Still, the decision whether to unroll a loop can be made semi-autonomously. For example, a user can specify a target or desired data throughput (data per time). If so, loops which prevent the design from meeting the target data throughput can be identified by estimating the operating frequency. Since loops dictate that new data can be applied only every "N" cycles, where "N" is the number of iterations, a determination can be made whether a given loop will overly limit the throughput, where throughput is equal to the operating frequency estimate divided by "N". If the loop is bounded and will overly limit the throughput, then the loop can be unrolled.

In step 760, the loop body copies can be wrapped in a sub-loop. The sub-loops can execute "N" times such that M *N=I, wherein I is equivalent to the total number of iterations of the loop body of the original loop construct. It should be appreciated, however, that the number "N" need not be the same from copy to copy. That is, one copy of the loop body can execute for a different number of iterations than another loop body copy. For example, a loop construct which is to execute 10 times can be replaced with 2 loop body copies each executing 5 times; with 5 loop body copies each executing 2 times; or with 4 loop body copies wherein three of the copies execute three times and the fourth executes one time. Any of a variety of combinations can be used so long as the total number of iterations is equivalent to the maximum number of iterations specified by the loop index. In step 765, the data flows between the loops can be connected such that each sub-loop can provide the necessary data values to the next sub-loop in the chain.

In step 770, in the case where loop parallelization is to be applied to a loop construct, any successive loops, or loops which follow one another, and which share a data dependency can be identified. In step 775 the data dependencies can be identified. In step 780, the data ordering can be identified. For example, the data processing of the two loop constructs can be examined for a relationship wherein the first value output from the data providing loop construct is the first value consumed by the data consuming loop construct. If such a relationship does not exist, one or both of the loop constructs can be logically reordered so that such a relationship does exist. This reordering, however, must not change any results generate by the modified loop construct.

In step 785, the loop constructs can be sequenced in stepwise fashion. Additionally, one or more control mechanisms can be inserted between the two loop constructs if required. The control mechanisms can signal data ready conditions from the supplying loop construct and/or a data consumed or wait condition for the consuming loop construct. The control mechanism effectively enables a loop construct data provider to signal to the loop construct data consumer that data is available and/or allows the loop construct data consumer to signal to the loop construct data provider that it is ready for a next data element. Accordingly, loop parallelization allows the loop construct data consumer to begin execution before the loop construct data supplier has completed execution.

Ensuring that the sequenced loops stay in "lockstep" with one another is critical. One mechanism for ensuring such synchronization is to set a semaphore or true signal in the first loop as a data element is generated. The first loop can poll a second semaphore which is sourced from the second loop. The first loop will not begin processing the next iteration until it receives this second semaphore from the second loop. The second loop, meanwhile, can poll and wait on the first semaphore from the first loop. When the second loop receives a true value for the first semaphore of the first loop, the second loop can consume the data value generated by the first loop. Simultaneously, the second loop will set the second semaphore true to indicate to the first loop that the second loop may proceed with generating the next data element. After consuming the data, the second loop will then begin polling the first semaphore again, to wait for the next signal from the first loop. In this manner the two loops are kept in lockstep.

Notably, as an additional optimization, if an analysis of the loops indicates that one loop is guaranteed to execute faster than the other loop, then the signaling from the faster loop to the slower loop can be eliminated. If the slower loop is the data consumer, the slower loop can assume that the data will be available. If the slower loop is the data producer, the slower loop can assume that the consuming loop will be ready to consume. In any case, the slower loop must signal back to the faster loop that it has consumed or produced the data to allow it to proceed and process the next data.

One example of a case in which the loop parallelization technique can be applied is where a first loop construct populates an array with data values. The second loop construct processes the array values and populates a second array with the results. If both loop constructs iterate over the array in the same order, the second loop construct can process data elements from the first array as the first loop construct writes each element, rather than waiting until each data element of the first array is written before allowing the second loop construct to access the first array.

Loop parallelization can be applied to more than two loop constructs. For example, chains of 2, 3, 4, or more loop constructs in the LIM which have data dependencies can be processed using loop parallelization techniques. Also, as noted, loop parallelization can be applied to cases wherein multiple data items are exchanged per iteration, rather than a single data element or value. After step 785, the method can loop back to step 710 to process further loop constructs as may be required.

After application of method 700, the LIM is still a well-formed LIM which has been optimized with regard to hardware representations of general-purpose, high level language loop constructs. After the loop construct optimization is applied to the LIM, the LIM can be scheduled. That is, the physical connections for each component can be determined. The physical connections refer to the implemented data flows that will ultimately be constructed using actual wires or electrical connections in addition to any hardware that is needed to preserve the semantics of the LIM in the hardware implementation.

The connections can be specified such that the data dependencies and control restraints of each component in the LIM are satisfied. For example, scheduling ensures that each component is activated when (1) the flow of control reaches that component, and (2) all of the data inputs to the component are available. As noted, scheduling can require the addition of hardware components, such as latches for data inputs or flip-flops for the control signal. Scheduling can proceed in a bottom-up fashion beginning with the lowest level components.

Additional optimizations can be performed during the scheduling process. For example, the LIM can be balanced. Balancing refers to the inclusion of delay registers in the LIM to ensure that each data and control path through the LIM requires the same number of clock cycles from beginning to end. Balancing allows a new set of data to be inserted into the design each clock cycle. Pipelining also can be performed. Pipelining refers to the inclusion of registers in the data path to reduce the length of combinational logic paths. Pipelining can increase the effective frequency of the design.

Once the connections have been made, and optimizations have been applied, the resulting LIM can be translated into a target hardware description language. As the LIM is effectively a hierarchical netlist at this point in the process, the transformation of the LIM to a target hardware description language is readily performed.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A processor-based method of processing a general-purpose, high level language program to determine a hardware representation of the program, said method comprising:
    generating a language independent model of the general-purpose, high level language program;
    identifying a loop construct within the language independent model;
    determining whether the loop construct is bounded;
    determining, in response to determination of the loop construct being bounded, a maximum number of iterations of the loop construct;
    comparing the maximum number of iterations to a threshold value stored prior to the generating of the language independent model;
    selecting, in response to the maximum number of iterations exceeding the threshold value, a loop processing technique for unrolling the loop construct according to stored user preferences; and
    unrolling the loop construct by replicating, in the language independent model, a body portion of the loop construct as specified by the selected loop processing technique.

2. The method of claim 1, further comprising scheduling the language independent model.

3. The method of claim 2, further comprising:
    generating a hardware description language representation from the language independent model.

4. The method of claim 1, further comprising repeating said steps of identifying a loop construct, determining whether the loop construct is bounded, determining a maximum number of iterations, comparing the maximum number of iterations, selecting a loop processing technique, and unrolling the loop construct for additional loop constructs in the language independent model.

5. The method of claim 1, said step of identifying a loop construct further comprising:
identifying a decision component of the loop construct;
identifying an initial value of a loop index of the loop construct;
identifying an ending value for the loop index; and
identifying an update expression for updating the loop index.

6. The method of claim 5, said step of determining whether the loop construct is bounded further comprising:
determining whether the ending value of the loop index is a constant value;
determining whether the initial value of the loop index is a constant value; and
determining whether the update expression produces a predictable result.

7. The method of claim 1, said unrolling step further comprising:
determining a maximum number of iterations for the loop construct;
copying the body portion of the loop construct until the total number of body portions is equal to the maximum number of loop construct iterations;
sequencing the body portions according to when the loop construct would have been enabled and the existence of control decisions within the loop construct; and
replacing references to the loop index in each body portion with a constant value associated with that particular body portion copy.

8. The method of claim 1, further comprising:
copying the body portion of the loop construct into the language independent model a predetermined number of times which is less than the maximum number of iterations;
encapsulating each body portion within a sub-loop construct such that the total number of executions of each body portion within the sub-loop constructs is equal to the maximum number of iterations; and
connecting data flows between the respective sub-loop constructs such that each sub-loop construct receives proper data input.

9. A method of processing a general-purpose, high level language program to determine a hardware representation of the program, said method comprising:
generating a language independent model of the general-purpose, high level language program;
identifying at least two loop constructs within the language independent model having a data processing dependency;
determining whether each loop construct is bounded;
determining, in response to determination of the loop construct being bounded, a maximum number of iterations of the loop construct;
comparing the maximum number of iterations to a threshold value stored prior to the generating of the language independent model;
identifying, in response to the maximum number of iterations exceeding the threshold value, a data processing order for the loop constructs wherein data generated by one of the loop constructs is consumed by a next one of the loop constructs in stepwise fashion;
sequencing each of the loop constructs to function in stepwise fashion; and
wherein the sequencing is according to the data processing order from the identifying step.

10. The method of claim 9, further comprising:
if the loop constructs do not function in stepwise fashion, re-ordering logic of at least one of the loop constructs such that data generated by one of the loop constructs is consumed by a next one of the loop constructs in stepwise fashion.

11. The method of claim 9, further comprising:
inserting a control mechanism between each loop construct to enable the loop constructs to signal that data is available or that data is needed.

12. The method of claim 9, further comprising scheduling the language independent model.

13. The method of claim 12, further comprising:
generating a hardware description language representation from the language independent model.

14. A machine-readable storage, having stored thereon a computer program having a plurality of code sections executable by a machine for causing the machine to perform the steps of:
generating a language independent model of a general-purpose, high level language program;
identifying a loop construct within the language independent model;
determining whether the loop construct is bounded;
determining, in response to determination of the loon construct being bounded, a maximum number of iterations of the loon construct;
comparing the maximum number of iterations to a threshold value stored prior to the generating of the language independent model;
selecting, in response to the maximum number of iterations exceeding the threshold value, a loop processing technique for unrolling the loop construct according to stored user preferences; and
unrolling the loop construct by replicating, in the language independent model, a body portion of the loop construct as specified by the selected loop processing technique.

15. The machine-readable storage of claim 14, further comprising scheduling the language independent model.

16. The machine-readable storage of claim 15, further comprising:
generating a hardware description language representation from the language independent model.

17. The machine-readable storage of claim 14, further comprising repeating said steps of identifying a loop construct, determining whether the loop construct is bounded, determining a maximum number of iterations, comparing the maximum number of iterations, selecting a loop processing technique, and unrolling the loop construct for additional loop constructs in the language independent model.

18. The machine-readable storage of claim 14, said step of identifying a loop construct further comprising:
identifying a decision component of the loop construct;
identifying an initial value of a loop index of the loop construct;
identifying an ending value for the loop index; and
identifying an update expression for updating the loop index.

19. The machine-readable storage of claim 18, said step of determining whether the loop construct is bounded further comprising:
   determining whether the ending value of the loop index is a constant value;
   determining whether the initial value of the loop index is a constant value; and
   determining whether the update expression produces a predictable result.

20. The machine-readable storage of claim 14, said unrolling step further comprising:
   copying the body portion of the loop construct until the total number of body portions is equal to the maximum number of loop construct iterations;
   sequencing the body portions according to when the loop construct would have been enabled and the existence of control decisions within the loop construct; and
   replacing references to the loop index in each body portion with a constant value associated with that particular body portion copy.

21. The machine-readable storage of claim 14, further comprising:
   copying the body portion of the loop construct into the language independent model a predetermined number of times which is less than the maximum number of iterations;
   encapsulating each body portion within a sub-loop construct such that the total number of executions of each body portion within the sub-loop constructs is equal to the maximum number of iterations; and
   connecting data flows between the respective sub-loop constructs such that each sub-loop construct receives proper data input.

22. A machine-readable storage, having stored thereon a computer program having a plurality of code sections executable by a machine for causing the machine to perform the steps of:
   generating a language independent model of a general-purpose, high level language program;
   identifying at least two loop constructs within the language independent model having a data processing dependency;
   determining whether each loop construct is bounded;
   determining, in response to determination of the loop construct being bounded, a maximum number of iterations of the loop construct;
   comparing the maximum number of iterations to a threshold value stored prior to the generating of the language independent model;
   identifying, in response to the maximum number of iterations exceeding the threshold value, a data processing order for the loop constructs wherein data generated by one of the loop constructs is consumed by a next one of the loop constructs in stepwise fashion;
   sequencing each of the loop constructs to function in stepwise fashion; and
   wherein the sequencing is according to the data processing order from the identifying step.

23. The machine-readable storage of claim 22, further comprising:
   if the loop constructs do not function in stepwise fashion, re-ordering logic of at least one of the loop constructs such that data generated by one of the loop constructs is consumed by a next one of the loop constructs in stepwise fashion.

24. The machine-readable storage of claim 22, further comprising:
   inserting a control mechanism between each loop construct to enable the loop constructs to signal that data is available or that data is needed.

25. The machine-readable storage of claim 22, further comprising scheduling the language independent model.

26. The machine-readable storage of claim 25, further comprising:
   generating a hardware description language representation from the language independent model.

* * * * *